(12) United States Patent
Rueb et al.

(10) Patent No.: US 7,132,726 B2
(45) Date of Patent: Nov. 7, 2006

(54) INTEGRATED SEMICONDUCTOR CIRCUIT HAVING A LOGIC AND POWER METALLIZATION WITHOUT INTERMETAL DIELECTRIC

(75) Inventors: Michael Rueb, Faak am See (AT); Thomas Detzel, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/037,273

(22) Filed: Jan. 18, 2005

(65) Prior Publication Data

US 2005/0179068 A1  Aug. 18, 2005

(30) Foreign Application Priority Data

Jan. 23, 2004  (DE) .................... 10 2004 003 538

(51) Int. Cl.
 *H01L 29/00* (2006.01)
 *H01L 23/52* (2006.01)
(52) U.S. Cl. .................. 257/500; 257/750; 257/775
(58) Field of Classification Search .......... 257/500, 257/750, 751, 765, 775
See application file for complete search history.

(56) References Cited

U.S. PATENT DOCUMENTS

| 4,718,977 | A |   | 1/1988 | Contiero et al. |
| 4,807,007 | A | * | 2/1989 | Borrello et al. ............. 257/442 |
| 6,020,640 | A | * | 2/2000 | Efland et al. ................ 257/751 |
| 2001/0018257 | A1 | * | 8/2001 | Mathews ..................... 438/486 |

* cited by examiner

*Primary Examiner*—Lex H. Malsawma
(74) *Attorney, Agent, or Firm*—Dicke, Billig & Czaja PLLC

(57) ABSTRACT

An integrated semiconductor circuit having a first and a second portion of a substrate, in which a power semiconductor circuit structure and a logic circuit structure are respectively formed. The metallization having a power metal layer and an in relative terms thinner logic metal layer, the two metal layers being located directly above one another in this order, without an intermetal dielectric between them, only in the first portion above the power semiconductor circuit structure, and an uninterrupted conductive barrier layer being located at least between the power metal layer and the intermediate oxide layer and also between the power metal layer and the contact regions and electrode portions of the power semiconductor circuit structure which it contact-connects, and to a method for fabricating it.

18 Claims, 4 Drawing Sheets

INTEGRATED SEMICONDUCTOR CIRCUIT HAVING A LOGIC AND POWER METALLIZATION WITHOUT INTERMETAL DIELECTRIC

CROSS-REFERENCE TO RELATED APPLICATIONS

This Utility Patent Application claims priority to German Patent Application No. DE 10 2004 003 538.5, filed on Jan. 23, 2004, which is incorporated herein by reference.

FIELD OF THE INVENTION

The invention relates to an integrated semiconductor circuit.

BACKGROUND

Power semiconductor components which combine DMOS power transistors with large scale integrated logic impose particular demands on the metallization. To allow bonding to an active area, i.e. directly above the DMOS transistor cells, on the one hand a metal thickness of at least 3.0 µm is required. On the other hand, the logic metallization should be patterned as finely as possible in order to achieve a high packing density. However, this considerably limits the thickness of the metallization layer which can be used in the logic circuit structure.

With new power semiconductor circuit technologies, the problem is arising whereby the metal thicknesses which are required over the power DMOS transistor structure can no longer easily be patterned with the required fineness in the region of the logic circuit. In a modern power semiconductor technology, for example, a thickness of the power metallization of 3.5 µm and the following logic design rules are requirements: metal width: 1.6 µm; metal interconnect spacing: 1.6 µm and contact hole size: 1.2 µm. With a logic metallization thickness of 1.0 µm, these feature sizes can be produced without difficulties using current processes.

The problem of using finely patterned metal interconnects in the logic circuit structure to intelligently and inexpensively connect a thick power metallization has hitherto been solved by the circuitous route of a relatively expensive two-layer metallization. It is therefore desirable to simplify the metallization integration in order to reduce the process costs and enhance the competitiveness of modern technologies.

The present applicant has pursued the following solution approaches with a view to solving the problem described above in the technologies for the fabrication of integrated power semiconductor circuits:

I. In one technology for integrated power semiconductor circuits which is in production with the applicant, a 3.2 µm thick AlSiCu layer is sputtered on after the contact hole patterning and this layer is then patterned by plasma-chemical means using photoresist as a mask. This is followed by passivation and imide processing. The contact and metallization structures are relatively large, allowing this simple fabrication method which includes only one metallization level to be used.

II. Another technology which is in use with the present applicant for the fabrication of integrated power semiconductor circuits uses a significantly more complex two-layer metallization. After the contact hole patterning, a 1.0 µm thick AlSiCu layer is sputtered on and then once again patterned by plasma-chemical means using photoresist as a mask. Then, an oxide-nitride layer sequence is deposited and removed again above the DMOS surfaces and the contact-connection pads during the via etch. A further 2.5 µm thick AlSiCu layer is applied by sputtering and removed again using a photographic technique and a wet-chemical etch over the entirety of the logic surfaces apart from the logic contact-connection pads. As a result, a metallization thickness of 3.5 µm is achieved above the DMOS power transistor and in the contact-connection pads, whereas a passivated wiring with relatively small structures can be produced in the logic circuit. The metallization process is concluded by an imide processing operation.

In electrical terms, the intermetal dielectric is not required, since only a single metal level is used for wiring of the logic circuits. Consequently, the function of the intermetal dielectric is restricted to forming an etching stop for the wet-chemical power metal patterning and protecting the logic circuit metallization level below.

In view of the statements made above, it is an object of the present invention to provide an integrated semiconductor circuit of the type described in the introduction, as well as a method for fabricating it, which make it possible to realize an inexpensive and reliable logic and power metallization without the deposition and patterning of an intermetal dielectric for current and future integrated power semiconductor circuits.

SUMMARY

Having a first and a second portion of a substrate, in which a power semiconductor circuit structure and a logic circuit structure are respectively formed, an intermediate oxide layer, which insulates portions and regions which are not to be contact-connected, being formed over the power semiconductor circuit structure and the logic circuit structure, and a metallization for the electrical connection of contact regions and electrode portions of the power semiconductor circuit structure and of the logic circuit structure to one another and to other contact regions of the integrated semiconductor circuit being formed above the intermediate oxide layer, and to a method for fabricating an integrated semiconductor circuit of this type.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
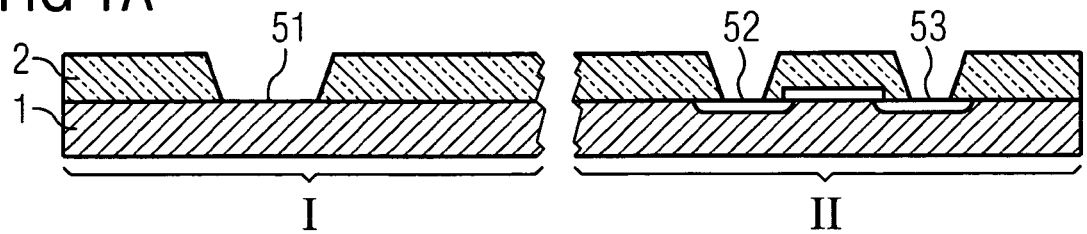
FIGS. 1A–1F illustrate diagrammatic cross-sectional views through an integrated semiconductor circuit to explain a first exemplary embodiment of a fabrication method according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Therefore, according to a first embodiment of the present invention, an integrated semiconductor circuit according to the invention of the generic type is distinguished by the fact that the metallization has a power metal layer and an in relative terms thinner logic metal layer, which two layers are located directly above one another in this order, without an intermetal dielectric between them, only in the first portion above the power semiconductor circuit structure, and an uninterrupted conductive barrier layer is located at least between the power metal layer and the intermediate oxide layer and between the power metal layer and the contact regions and electrode portions of the power semiconductor circuit structure which it contact-connects.

In an integrated semiconductor circuit according to the invention of this type, a barrier layer, which preferably consists of Ti/TiN, is present at the locations in the contacts or on the intermediate oxide which are covered with the power or logic metal layer. A metallization layer which is composed of the power metal layer deposited first of all and the logic metal layer which was subsequently applied is located above the barrier layer in the regions of the power semiconductor circuit structure and the contact-connection pads. The edges of the power metal layer surfaces are adjoined by areas in which only the logic metal layer is present directly above the barrier layer. The procedure according to the invention, at the connection locations between the power semiconductor circuit structure or the contact-connection pad metallization and the logic metal layer, necessarily leads to structures which are distinguished by the fact that the metallization, comprising the power metal layer and the logic metal layer, of the power semiconductor circuit structure and of the contact-connection pads merges seamlessly into the metalization of the logic circuit structure. Unlike in the procedure which has hitherto been customary, there is no intermetal dielectric between power metal layer and logic metal layer in the edges of the power semiconductor circuit structure and the contact-connection pads. There is no power metal layer in the areas of the logic circuit structure. The barrier layer is located in the contacts and beneath the interconnects in the logic circuit structure, and above the barrier layer there is only the logic metal layer.

Alternatively, the barrier layer may also be present only in the portion of the power semiconductor circuit structure. The term power semiconductor circuit structure is to be understood in general terms as meaning contact-connection pads of the logic. An antireflection coating, for example of TiN, may also be deposited above the logic metal layer in the portion of the logic circuit structure and in the portion of the power semiconductor circuit structure.

The passivation and imide layers, which are processed in the standard way, conclude the fabrication of the metallization. These layers are removed again above the bonding surfaces in the portion of the power semiconductor circuit structure and above the contact-connection pads. If a TiN antireflection coating is used, this coating is removed in the bonding surfaces during the passivation etch.

Preferred metal alloys for the logic metal layer and the power metal layer are AlCu and/or AlSiCu. Other possible metals or metal alloys include Cu, Ni, NiP, W.

In this context, it should be noted that if both the power metal layer and the logic metal layer consist of the same material, for example AlCu or AlSiCu, these combined two metallization layers, which are located above one another without an intermetal dielectric between them, form a single, thick power metallization and can no longer be distinguished from one another in the portion of the power semiconductor circuit structure.

According to a second embodiment, an integrated semiconductor circuit according to the invention is distinguished by the fact that the metallization in the portion I of the power semiconductor circuit structure and in the portion II of the logic circuit structure is formed by a single-layer metal layer of variable thickness, which is thinner or thinned in the portion II of the logic circuit structure compared to a relatively great thickness of the metal layer in the portion I of the power semiconductor circuit structure.

The power semiconductor circuit structure preferably includes a DMOS transistor; however, it should be noted that the integrated semiconductor circuit according to the invention can also be realized with other types of power semiconductor components.

According to a further aspect, the invention relates to a method for fabricating an integrated semiconductor circuit having a power semiconductor circuit structure formed in a first portion of a substrate and a logic circuit structure formed in a second portion of the substrate, comprising the following steps:

an intermediate oxide layer, which insulates portions and regions which are not to be contact-connected, is formed over the power semiconductor circuit structure and the logic circuit structure, and a metallization is formed above the intermediate oxide layer, in such a way that the metallization connects contact regions and electrode portions of the power semiconductor circuit structure and of the logic circuit structure to one another and to other contact regions of the integrated semiconductor circuit, the method also including the following successive steps:

A) depositing a conductive barrier layer on the intermediate oxide layer and into the contact regions which are to be contact-connected and are free of the intermediate oxide layer in both portions;

B) applying a power metal layer in both portions;

C) patterning the power metal layer in the first portion and removing the power metal layer in the second portion;

D) applying a logic metal layer, which is thinner than the power metal layer, over the entire surface, and E) patterning the logic metal layer, with the barrier layer also being etched through during this patterning in the second portion.

In accordance with an exemplary embodiment of the fabrication method according to the invention, the barrier layer can be removed again following the patterning step C). Furthermore, step D) may preferably be followed by a step D1) which forms an antireflection coating, for example of TiN, over the logic metal layer in the first and second portions. The metal layers applied in steps B) and D) may either both consist of AlCu or alternatively of AlSiCu. According to an alternative exemplary embodiment, the power metal layer applied in step B) may consist of AlCu and the logic metal layer applied in step D) of AlSiCu. However, it is also possible to use AlSiCu in step B) and AlCu in step D).

It is also preferable for the barrier layer deposited in step A) preferably to include a layer sequence of Ti/TiN.

This fabrication method according to the invention is distinguished by the following advantages:

(a) Unlike in the conventional procedure, there is no need for an intermetal dielectric (IMD) between the logic metal layer and the power metal layer. The complex and expensive CVD steps used to apply the IMD are eliminated.

(b) The photographic technique used to produce the vias and the corresponding via etch for patterning of the IMD are no longer required. In addition to the oxide etch, additional process steps are often necessary in order for the TiN antireflection coating on the metal, which is attacked during the oxide etch and is therefore visually noticeable, to be removed without residues in the vias. Moreover, the fabrication method according to the invention eliminates the resist and polymer removal processes which are required after a via etch.

(c) The thicknesses of the logic metal layer and the power metal layer can be varied within a wide range. By way of example, to allow even finer structures to be produced in the logic circuit portion, the thickness of the logic metal layer could be reduced and the thickness of the power metal layer increased to compensate. This would ensure a sufficient thickness of the overall metal layer in the portion of the power semiconductor circuit structure and in the contact-connection pads.

(d) The absence of the intermetal dielectric IMD has a beneficial effect on the component and gate oxide reliability. In particular, there is no risk of the components being impaired by plasma damage or emission of high-energy light, as may be the case with typical HDP processes. The procedure according to the invention may have a beneficial effect on undesired threshold voltage drifts, on the gate oxide quality and on the matching of the threshold voltages of current sense and power DMOS transistor.

(e) The use of a barrier (for example of Ti/TiN or similar materials) drastically improves the contact resistances on $n^+$-doping regions, as well as their scatter, since no epitaxial precipitations are formed in the Si contact surfaces.

(f) Furthermore, the use of a barrier makes it possible to employ AlCu as metal for the metallization. Consequently, there is no need to remove silicon particles during the wet-chemical etch of the power metal layer. Moreover, the barrier layer protects the sensitive silicon contact surfaces during the etching of the power metal layer.

(g) However, the barrier also allows a procedure with AlSiCu to be used. The silicon particles which remain after the wet-chemical etch of the power metal layer are present on the barrier and can be removed without problems, for example by means of a wet-chemical freckle etch. If the silicon particles were to be located directly on the silicon in the contacts, it could no longer be removed without the sensitive contact surfaces being attacked, since the removal of silicon particles by definition involves a high silicon etching rate. Not to remove the silicon grit particles after the etching of the power metal layer does not represent a realistic alternative, since they may have a size of from 1 to 2 μm, which means that they can be in the range of the feature sizes. On the one hand, the contact resistances would be greatly impaired, and on the other hand the deposition of the subsequent layers, for example the logic metal layer, would be impeded.

A fabrication method for an integrated semiconductor circuit which corresponds to a further aspect of the invention is distinguished by the fact that the metallization in the portion I of the power semiconductor circuit structure and in the portion II of the logic circuit structure is formed in the form of a metal layer of variable thickness, and this metal layer is applied in thinner form or is thinned in the portion II of the logic circuit structure compared to a relatively great thickness of the metal layer in the portion I of the power semiconductor circuit structure.

FIGS. 1A–1F use diagrammatic cross-sectional views to illustrate a first portion I, in which a power semiconductor circuit structure is formed, and a second portion II, in which a logic circuit structure is formed. The fabrication method according to the invention, which is explained below, can in principle be used for any integrated power semiconductor circuit technology. The power semiconductor circuit structure in the first portion I and the logic circuit structure in the second portion II are illustrated in highly diagrammatic form.

Following the front-end process steps, as they are known, in which the individual elements are integrated in a silicon substrate 1, an intermediate oxide layer 2 is deposited using conventional methods. The contact structures, as illustrated by reference numerals 51, 52, 53, are etched into this intermediate oxide layer 2.

Figure 1B:
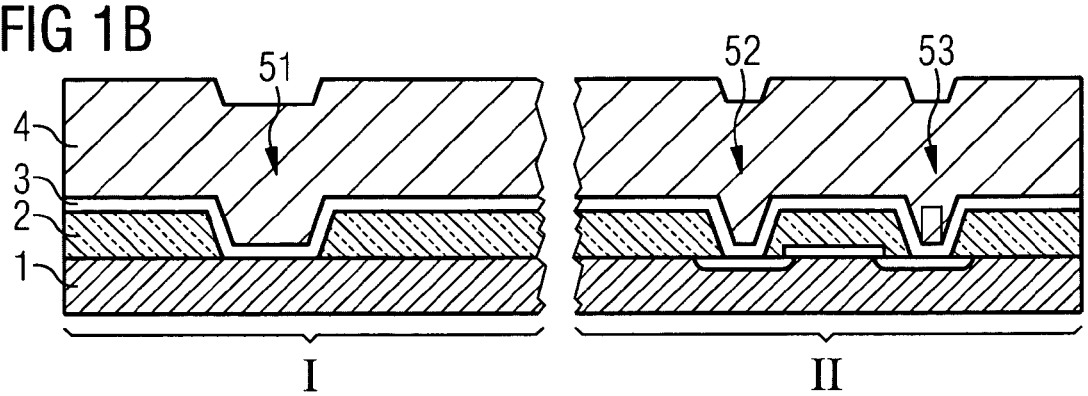
Figure 1C:
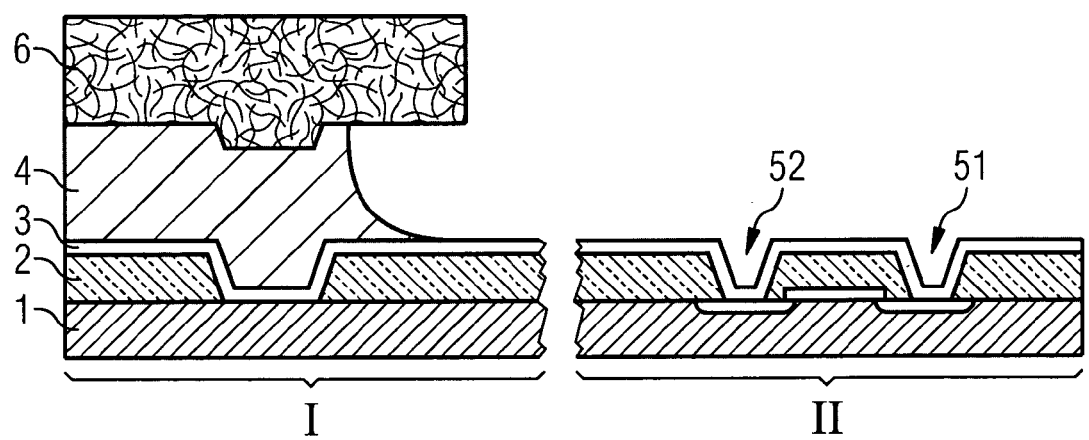

Then, in FIG. 1B, a conductive barrier 3, which consists, for example, of a Ti/TiN layer sequence, is deposited into the contacts 51, 52, 53 and on the remaining intermediate oxide 2. The wafer is then subjected to a heat treatment in order to increase the density of the barrier layer 3. Next, a thick power metal layer 4, for example of AlCu, e.g., with a Cu content of 0.5%, is applied. It should be noted that to prevent junction spiking, it is not necessary to add any silicon to the aluminum, since the barrier layer 3 reliably suppresses diffusion of silicon into the aluminum in the contacts 51, 52, 53. In the next step, illustrated in FIG. 1C, a first photographic technique, represented by a photoresist layer 6, and a wet-chemical etch are used to remove the power metal layer 4 in the portion II but not in the portion I of the power semiconductor circuit structure, and also in the contacts 52, 53 of the logic circuit structure. One factor in the fabrication method according to the invention is that the power metal layer 4 is also etched back out of the contacts 52, 53 of the logic circuit structure. However, the barrier 3 located beneath the power metal layer protects the contact surface of the contacts 52, 53 during the etching of the power metal layer. It should also be noted that the use of AlCu, unlike the procedure using AlSiCu for the metallization as has hitherto been customary, does not require the removal of silicon particles. The removal of the photoresist layer 6 concludes the patterning of the power metal layer 4. In this context, it should be noted that the thick power metallization is also present at the locations of contact-connection pads (not shown) in the portion II of the logic circuit structure and is not removed there.

Figure 1D:
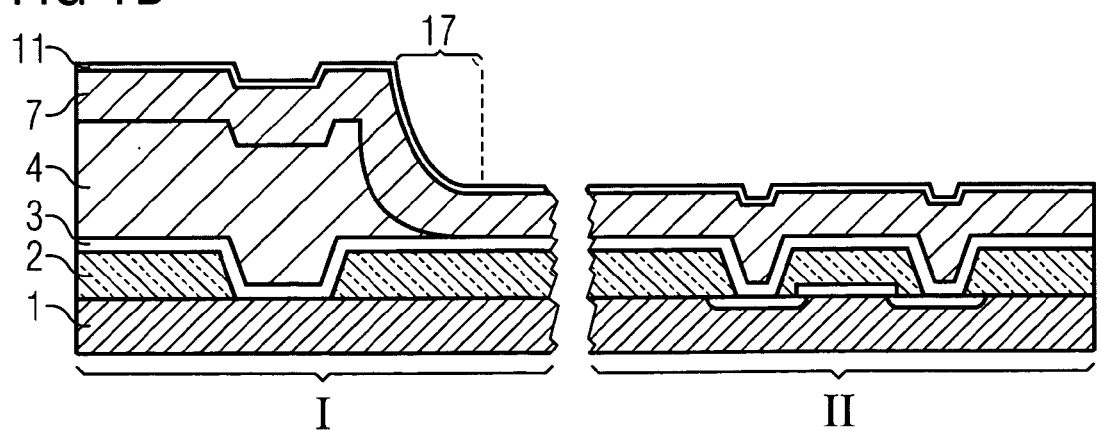
Figure 1E:
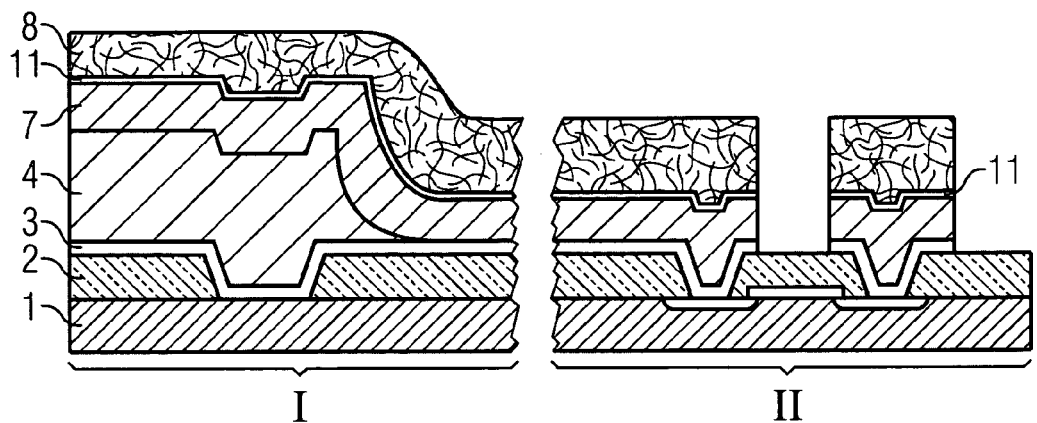

There then follows the production and patterning of the logic metallization, illustrated in FIGS. 1D and 1E. A metal layer 7 which is thin compared to the power metal layer 4 and consists, for example, of AlCu once again, and an antireflection coating 11 of, for example, TiN or amorphous silicon are deposited over the entire surface and patterned by plasma-chemical means using a further photographic technique, represented by a photoresist layer 8. The thickness of the antireflection coating 11 may be for example 25 nm. During the photographic technique, as illustrated in FIG. 1E, the barrier layer 3 is also etched through, since otherwise the conductivity of the barrier would cause short circuits between logic metal interconnects. In principle, the metal used for the power metal layer and the metal used for the logic metal layer may be different materials. The surfaces of the power semiconductor circuit structure in portion I and of the contact-connection pads are covered with photoresist 8 during the etching step illustrated in FIG. 1E, so that the logic metal layer is not attacked in these regions. Resist-free surfaces are present only at locations at which the power metal layer 4 has previously been removed.

Figure 1F:
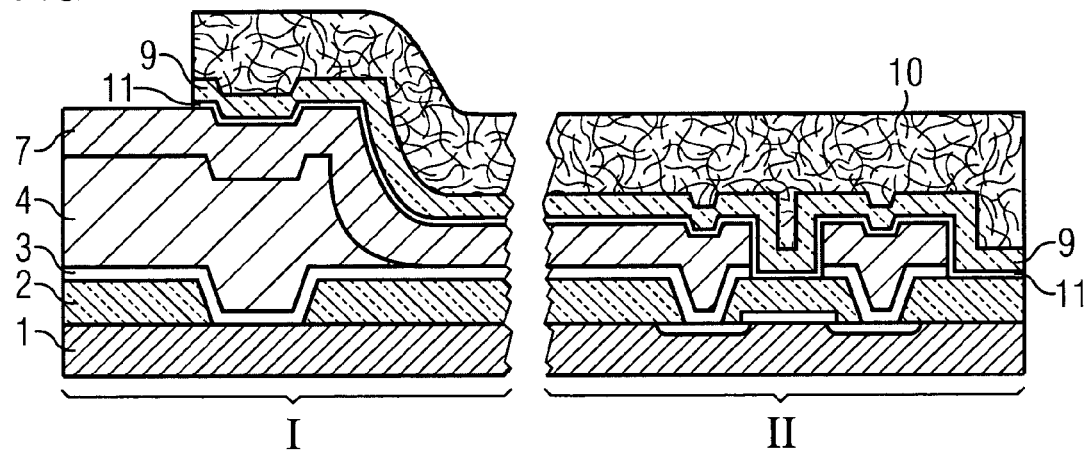

Following the conventional process steps used to remove resist and polymer, it is possible to deposit a passivation layer 9. This passivation layer 9 can be patterned by means of a further photographic technique (not shown) and etch. Finally, in general, a photoimide layer 10 is generally spun on and patterned by simple exposure and developing (not shown). In this context, it should be noted that the photographic technique (not shown) for the passivation layer 9 can be left out if the photoimide layer 10 is used as mask for the patterning of the passivation layer 9 (FIG. 1F).

The method steps according to the invention, which have been outlined above with reference to FIGS. 1A–1F lead, in the connection and transition locations, denoted by reference numeral 17 in FIG. 1D, between the metallization in the power semiconductor circuit portion I or the contact-connection pad metallization and the wiring in the portion II of the logic circuit structure, to structures which are characterized by the fact that the metallization in the portion I, comprising the combination of the power metal layer 4 and the logic metal layer 7, merges seamlessly into the logic metallization at the connection locations denoted by 17, and that, unlike in the case of conventional processing of integrated power semiconductor circuits, there is no intermetal dielectric between power metal layer and logic metal layer in the edges of the metallization of the power circuit structure in the portion I and the contact-connection pads of the logic.

Figure 2:
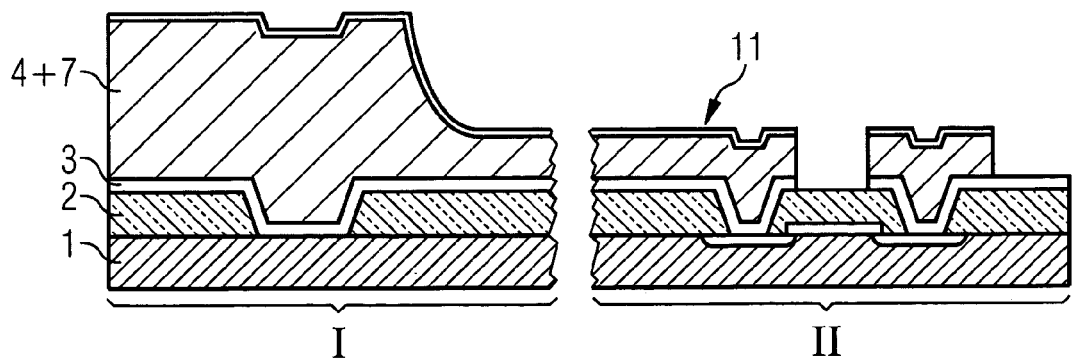
FIG. 2 illustrates a diagrammatic cross-sectional view through an integrated semiconductor circuit to explain a second exemplary embodiment of a fabrication method according to the invention.

FIG. 2 uses a diagrammatic cross section to show a second exemplary embodiment of an integrated semiconductor circuit according to the invention. The combination of power metal layer and logic metal layer, if the two layers consist of the same metal, for example of AlCu, leads to a single, thick metal layer 4+7 in the portion I of the power semiconductor circuit structure. It should be mentioned that the power metal layer 4+7 is not necessarily directly electrically connected to the logic metal layer 7 at its edge, since it may be electrically isolated at the interruption point indicated diagrammatically.

For reasons of simplicity, FIG. 2 only illustrates the actual metallization, without imide layer and passivation layer above it. The barrier 3 used is preferably a Ti/TiN layer sequence comprising, for example, approx. 2 to 50 nm of Ti and 50 to 200 nm of TiN. However, it is also possible to use other barrier materials, such as for example TiW. AlCu with a Cu content of approx. 0.5% is preferably used for the power metal layer 4 and the logic metal layer 7, since this obviates the need for removal of silicon particles after the wet-chemical etch of the power metal layer and AlCu can be etched significantly more easily than AlSiCu during the patterning of the logic metal layer. In accordance with FIG. 2, it is preferably for an approx. 10–100 nm thick TiN layer 11 to be deposited on the logic metal layer before the patterning of the latter; this TiN layer 11 serves as an effective antireflection coating during the photographic technique used for the logic metal layer and also improves the robustness of the logic metal interconnects with respect to electromigration and stress migration. As an alternative to an antireflection coating of TiN, it is also possible to use another form of antireflection coating 11, for example an antireflection coating of amorphous silicon. The antireflection coating 11 may also be removed again following the patterning of the logic metal layer.

A variant uses the alloy AlSiCu containing, for example, 1% of Si and 0.5% of Cu instead of AlCu for the power metal layer and the logic metal layer. This means that the density of the barrier layer 3 with respect to diffusion of substrate silicon in the contacts into the metal above, is not critical.

In a third exemplary embodiment, which is illustrated in FIGS. 3A–3D, the barrier layer 3 is removed again in the portion II following the patterning of the power metal layer 4. This procedure is distinguished by the advantage that what are known as ZAP diodes can be used without restriction. Diodes of this type are used to compensate circuit parts in the logic circuit structure and are based on junction spiking being deliberately induced in the contacts (cf. 52, 53 in FIG. 1A). A barrier in the contacts makes the spiking, which is brought about by the impression of a current, more difficult. The absence of a barrier in the contacts, however, means that AlSiCu has to be used for the logic metal layer in order to prevent spontaneous, that is to say undesirable, junction spiking.

Figure 3A:
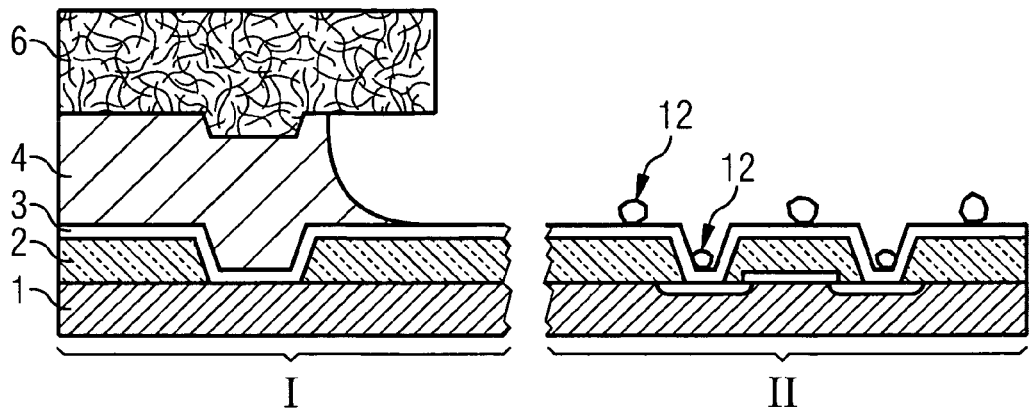
FIGS. 3A–3D illustrate diagrammatic cross-sectional views through an integrated semiconductor circuit to explain a third exemplary embodiment of a fabrication method according to the invention, in which the barrier in the logic circuit structure is removed.
Figure 3B:
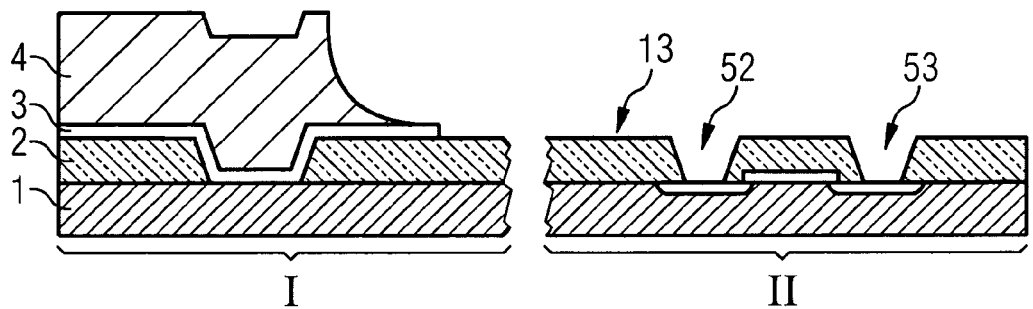
Figure 3C:
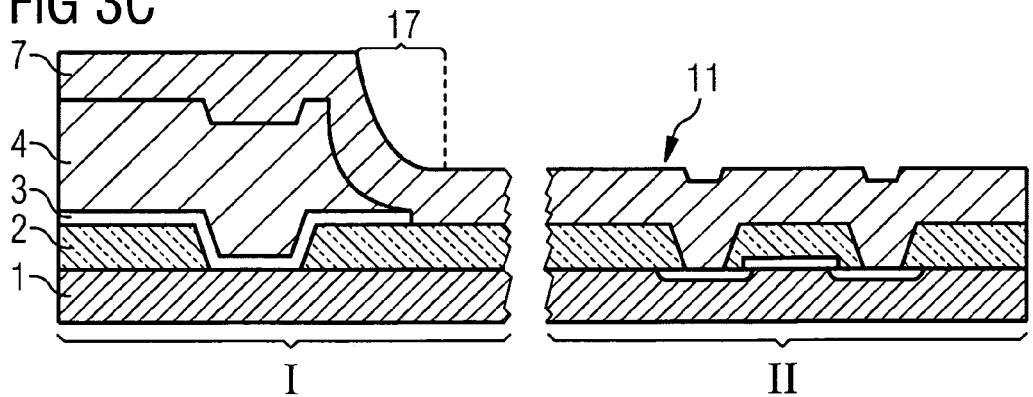
Figure 3D:
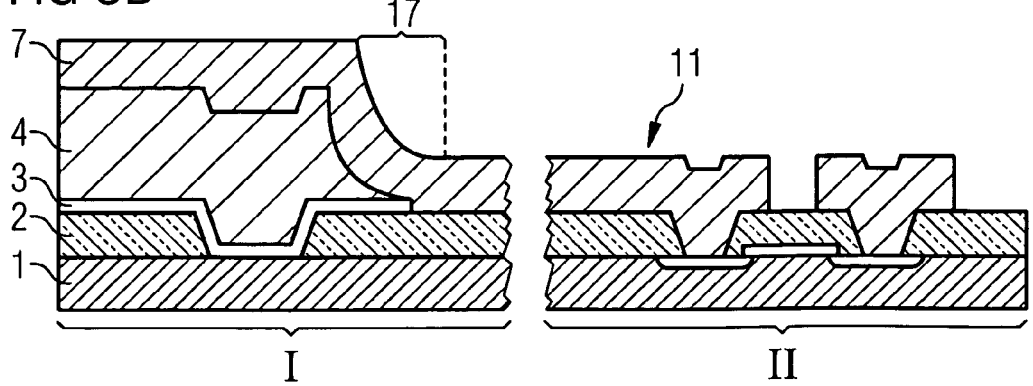

In accordance with FIG. 3A, the wet-chemical etch of the power metal layer 4, if AlSiCu is used as metal for the power metal layer 4, leaves behind silicon particle grains 12 on the barrier 3 in the portion II. These silicon particle grains 12 can be removed using a wet-chemical freckle etch. Moreover, it is possible for the silicon particles to be removed by plasma-chemical means, selectively with respect to the barrier layer 3 below. Then, in accordance with FIG. 3B, the barrier layer 3 in the portion II is etched away, which can be done by wet-chemical or plasma-chemical means. Then, the logic metal layer 7 is applied, and an antireflection coating 11 of TiN can in turn be formed above this (FIG. 3C). The logic metal layer 7 is patterned by means of a photographic technique (not shown) and a plasma etch. The logic metal layer 7 may in principle consist either of AlSiCu or of AlCu (for exceptions cf. above).

Finally, in a variant of the third exemplary embodiment shown in FIGS. 3A–3D with the barrier layer 3 removed, the metal of the power metal layer 4 may consist of AlCu, whereas AlSiCu is used for the logic metal layer 7. This has the advantage that no silicon particles 12 remain after the etching of the power metal layer. The method according to the invention is not restricted to the use of the metals AlCu and AlSiCu. In principle, all coatings of good conductivity which can be patterned by wet-chemical or plasma-chemical means with sufficient selectivity with respect to a barrier below are conceivable metals for the power metal layer.

By contrast, the selectivity with respect to the barrier 3 is of no relevance to the choice of metal for the logic metal layer, since the barrier layer 3 also has to be etched through during patterning of the logic metal.

Finally, a fourth exemplary embodiment is described, which makes do without a barrier but in structural terms leads to the same result as the method which has been described above on the basis of the first to third exemplary embodiments. This fourth exemplary embodiment combines a thick power metal layer 104 and a finely patterned, thinner or thinned logic metallization 107. Cu, AlCu, AlSiCu, W, Ni, NiP or combinations thereof can advantageously be used for the metal layer 104, 107. Other materials are also possible.

Figure 4A:
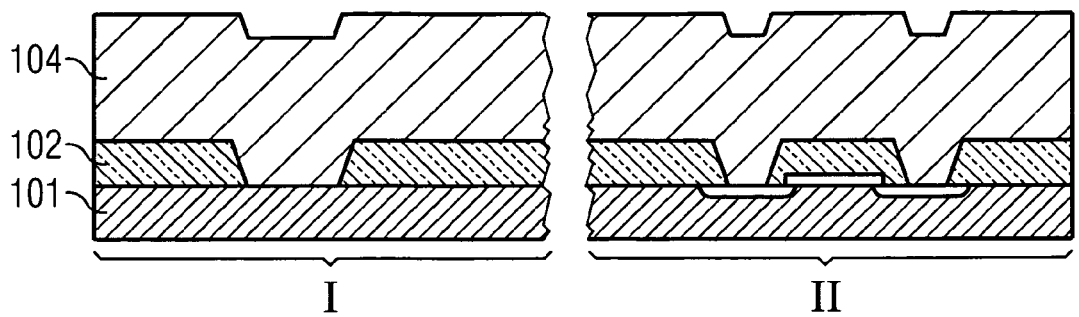
FIGS. 4A–4D illustrate diagrammatic cross-sectional views through an integrated semiconductor circuit to explain a fourth exemplary embodiment of a fabrication method according to the invention, in which a single, thick power metal layer is deposited over the portion of the power semiconductor circuit structure and over the portion of the logic circuit structure, and is then thinned only in the portion of the logic circuit structure.
Figure 4B:
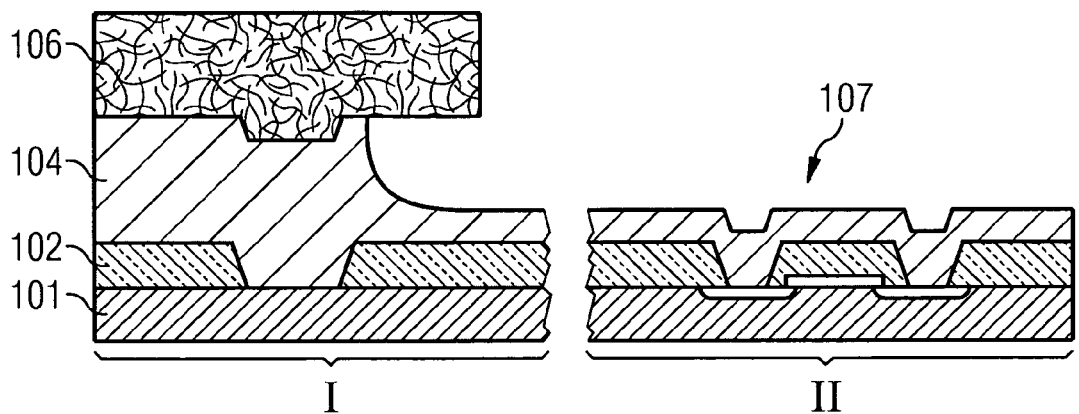
Figure 4C:
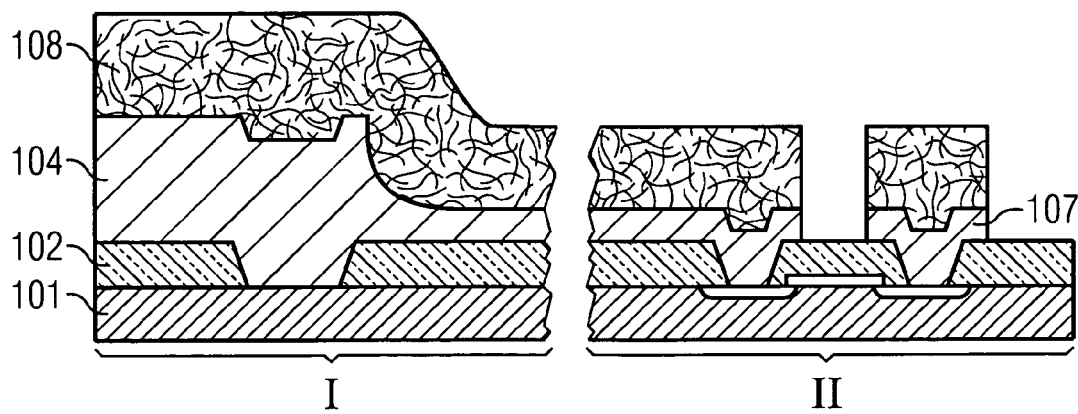

In the exemplary embodiment of the fabrication method illustrated in FIGS. 4A–4D, first of all, in accordance with FIG. 4A, a thick metal layer 104 is deposited, and this layer is thinned by means of a wet-chemical or plasma-chemical fixed-time etch in the portion II of the logic circuit structure (FIG. 4B). The portion I comprising the power semiconductor circuit structure, in which a thick metal layer is to remain in place, is covered with resist 106 using a photographic technique. After the removal of etching residues, for example Si particles, if AlSiCu is used as material for the metal layer, the wiring of the logic circuit structure in the portion II is patterned by means of a second photographic technique using a photoresist layer 108 (FIG. 4C). This procedure has the following drawbacks compared to the exemplary embodiments of the fabrication method according to the invention which have been described above on the basis of FIGS. 1A–1F, 2 and 3A–3D:

Thick metallization layers (>3.0 µm) cannot be sputtered without voids into the topographies of the extremely small contacts (1.2 µm) used, for example, in modern power semiconductor technologies.

The etchback of polycrystalline materials will lead to a rough surface; a preferential etching attack is likely in particular along grain boundaries.

On account of fluctuations in the material-removal rate during the etchback, considerable variations in the layer thickness are likely in the logic metal layer which remains.

The advantage of the fabrication method described most recently is that there is no need for a barrier layer.

Figure 4D:
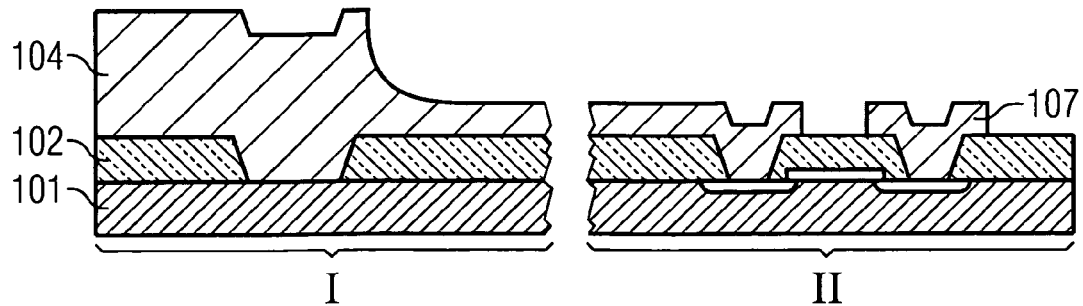

Apart from these drawbacks of the procedure, however, the structure shown in FIG. 4D, setting aside the absence of the barrier, does not differ from a structure achieved using the previous exemplary embodiments of the fabrication method according to the invention, provided that the same metal is used for the power metal layer and the logic metal layer in the latter. In general, a fabrication method which produces a single-layer metal layer 104, 107 with a variable thickness, such that this layer is relatively thick in the portion I and relatively thin in the portion II, can also lead to the structure shown in FIG. 4D.

In view of what has been stated above, the fabrication method according to the invention is distinguished by the fact that the sequence involved in the fabrication of the logic wiring and the metallization of the power semiconductor circuit structure is reversed compared to the conventional procedure. This makes it possible to eliminate the intermetallic dielectric and its patterning required in the conventional procedure. In the conventional procedure, the only function of the intermetal dielectric is to protect the logic metal layer from an etching attack during the (wet-chemical) etch of the power metal layer. Since the patterning of the power metal layer takes place prior to that of the logic metal layer, there is no need for a layer which has to protect the logic metal layer from the etching of the power metal layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated semiconductor circuit comprising:
   a first and a second portion of a substrate, in which a power semiconductor circuit structure and a logic circuit structure are respectively formed;
   an intermediate oxide layer, which insulates portions and regions which are not to be contact-connected, being formed over the power semiconductor circuit structure and the logic circuit structure; and
   a metallization for the electrical connection of contact regions and electrode portions the power semiconductor circuit structure and of the logic circuit structure to one another and to other contact regions of the integrated semiconductor circuit being formed above the intermediate oxide layer;
   wherein the metallization has a power metal layer and an in relative terms thinner logic metal layer, which two metal layers are located directly above one another without an intermetal dielectric between them only in the first portion above the power semiconductor circuit structure in the order of the power metal layer as the first metal layer on the intermediate oxide layer, on the electrode portions, and on the contact regions of the power semiconductor circuit structure and the logic metal layer as the second metal layer on the power metal layer and the intermediate oxide layer, and an uninterrupted conductive barrier layer is located at least between the power metal layer and the intermediate oxide layer and between the power metal layer and the contact regions and electrode portions of the power semiconductor circuit structure which the power metal layer contact-connects.

2. The integrated semiconductor circuit of claim 1, comprising:
   wherein the barrier layer is only present in the first portion.

3. The integrated semiconductor circuit of claim 1, comprising:
   wherein the barrier layer is also present in the second portion between the logic metal layer and the intermediate oxide layer and also between the contact regions and electrode portions which are contact-connected by the logic metal layer.

4. The integrated semiconductor circuit of claim 1, comprising:
   wherein an antireflection coating of TiN is present above the logic metal layer in the first and second portions.

5. The integrated semiconductor circuit of claim 1, comprising:
   wherein the power metal layer and the logic metal layer both consist of AlCu.

6. The integrated semiconductor circuit of claim 1, comprising:
   wherein the power metal layer and the logic metal layer consist of AlSiCu.

7. The integrated semiconductor circuit of claim 1, comprising:
wherein the power metal layer consists of AlSiCu and the logic metal layer consists of AlCu.

8. The integrated semiconductor circuit claim 1, comprising:
wherein the power metal layer consists of AlCu and the logic metal layer consists of AlSiCu.

9. The integrated semiconductor circuit of claim 1, comprising:
wherein the barrier layer consists of a Ti/TiN layer sequence or of TiW.

10. The integrated semiconductor circuit of claim 1, wherein the power semiconductor circuit structure includes at least one DMOS transistor.

11. An integrated semiconductor circuit comprising:
a first and a second portion of a substrate, in which a power semiconductor circuit structure and a logic circuit structure are respectively formed;
an intermediate oxide layer, which insulates portions and regions which are not to be contact-connected, being formed over the power semiconductor circuit structure and the logic circuit structure;
and a metallization for the electrical connection of contact regions and electrode portions of the power semiconductor circuit structure and of the logic circuit structure to one another and to other contact regions of the integrated semiconductor circuit being formed above the intermediate oxide layer;
wherein the metallization in the portion of the power semiconductor circuit structure and in the portion of the logic circuit structure is formed by a single-layer metal layer of variable thickness, which is thinner or thinned in the portion of the logic circuit structure compared to a relatively larger thickness of the metal layer in the portion of the power semiconductor circuit structure.

12. The integrated semiconductor circuit of claim 11, wherein the metal layer consists of Cu, AlCu, AlSiCu, W, Ni or NiP.

13. The integrated semiconductor circuit of claim 11, wherein the power semiconductor circuit structure includes at least one DMOS transistor.

14. The integrated semiconductor circuit of claim 11, further comprising:
a conductive barrier layer located between the metal layer and the intermediate oxide layer.

15. The integrated semiconductor circuit of claim 14, wherein the barrier layer is only present in the first portion.

16. The integrated semiconductor circuit of claim 14, wherein the barrier layer consists of a Ti/TiN layer sequence or of TiW.

17. The integrated semiconductor circuit of claim 11, further comprising:
an antireflection coating of TiN above the metal layer.

18. An integrated semiconductor circuit comprising:
a first and a second portion of a substrate, in which a power semiconductor circuit structure and a logic circuit structure are respectively formed;
an intermediate oxide layer, which insulates portions and regions which are not to be contact-connected, being formed over the power semiconductor circuit structure and the logic circuit structure; and
metallization means for the electrical connection of contact regions and electrode portions of the power semiconductor circuit structure and of the logic circuit structure to one another and to other contact regions of the integrated semiconductor circuit being formed above the intermediate oxide layer;
wherein the metallization means has a power metal layer and an in relative terms thinner logic metal layer, which two metal layers are located directly above one another without an intermetal dielectric between them only in the first portion above the power semiconductor circuit structure in the order of the power metal layer as the first metal layer on the intermediate oxide layer, on the electrode portions, and on the contact regions of the power semiconductor circuit structure and the logic metal layer as the second metal layer on the power metal layer and the intermediate oxide layer, and an uninterrupted conductive barrier layer is located at least between the power metal layer and the intermediate oxide layer and between the power metal layer and the contact regions and electrode portions of the power semiconductor circuit structure which the power metal layer contact-connects.

* * * * *